United States Patent [19]

Kenney

[11] Patent Number: 4,751,558
[45] Date of Patent: Jun. 14, 1988

[54] HIGH DENSITY MEMORY WITH FIELD SHIELD

[75] Inventor: Donald M. Kenney, Shelburne, Vt.

[73] Assignee: International Business Machines Corporation, Armonk, N.Y.

[21] Appl. No.: 793,401

[22] Filed: Oct. 31, 1985

[51] Int. Cl.[4] ............................................. H01L 29/78
[52] U.S. Cl. ..................................... 357/23.6; 357/49; 357/59; 357/53; 357/54; 357/45
[58] Field of Search ................. 357/23.6, 54, 49, 59 J, 357/59 G, 54 N, 45, 14, 53

[56] References Cited

U.S. PATENT DOCUMENTS

| | | | |
|---|---|---|---|
| 3,387,286 | 6/1968 | Dennard | 340/173 |
| 3,811,076 | 5/1974 | Smith, Jr. | 317/235 R |
| 3,841,926 | 10/1974 | Garnache et al. | 148/188 |
| 4,225,945 | 9/1980 | Kuo | 365/149 |
| 4,271,418 | 6/1981 | Hiltpold | 357/23 |
| 4,327,476 | 5/1982 | Iwai et al. | 29/571 |
| 4,335,450 | 6/1982 | Thomas | 365/182 |
| 4,397,075 | 8/1983 | Fatula et al. | 29/571 |
| 4,462,040 | 7/1984 | Ho et al. | 357/23 |
| 4,672,410 | 6/1987 | Miura et al. | 357/23.11 X |

FOREIGN PATENT DOCUMENTS

| | | | |
|---|---|---|---|
| 0159824 | 10/1985 | European Pat. Off. | 357/23.6 X |
| 58-213464 | 12/1983 | Japan | 357/23.6 X |

OTHER PUBLICATIONS

V. L. Rideout, IBM Technical Disclosure Bulletin, vol. 21, No. 9, Feb. 1979, pp. 3823-3825, "Double Polysilicon Dynamic Random-Access Memory Cell with Increased Charge Storage Capacitance".

G. V. Clarke et al., IBM Technical Disclosure Bulletin, vol. 17, No. 9, Feb. 1975, pp. 2579-2580, "Capacitor for Single FET Memory Cell".

C. G. Jambotkar, IBM Technical Disclosure Bulletin, vol. 25, No. 2, Jul. 1982, pp. 593-596, "Very Dense One-Device FET Memory Cell".

B. El-Kareh et al., IBM Technical Disclosure Bulletin, vol. 26, No. 9, Feb. 1984, pp. 4699-4701, "Trench Node One-Device Memory Cell Process".

U.S. patent application Ser. No. 182,724, filed 8/80 to S. A. Abbas et al.

Primary Examiner—Andrew J. James
Assistant Examiner—William A. Mintel
Attorney, Agent, or Firm—Stephen J. Limanek

[57] ABSTRACT

A memory cell formed in a groove or trench in a semiconductor substrate is provided which includes a storage capacitor located at the bottom and along the lower portion of the sidewalls of the trench, a bit/sense line disposed at the surface of the semiconductor substrate adjacent to the trench, a transfer device or transistor located on the sidewall of the trench between the capacitor and the bit/sense line and a field shield for electrically isolating the storage capacitor from an adjacent cell formed in the same semiconductor substrate.

17 Claims, 2 Drawing Sheets

HIGH DENSITY MEMORY WITH FIELD SHIELD

TECHNICAL FIELD

This invention relates to integrated semiconductor memory circuits and more particularly to a memory with a high density of cells, each of which employs a capacitor for storing a binary digit of information.

BACKGROUND ART

Integrated semiconductor memory circuits, particularly those employing cells which include essentially a storage capacitor and a switch have achieved high memory cell densities. One of the simplest circuits for providing a small dynamic memory cell is described in commonly assigned U.S. Pat. No. 3,387,286, filed July 14, 1967, by R. H. Dennard. Each cell employs a storage capacitor and a field effect transistor acting as a switch to selectively connect the capacitor to a bit/sense line.

In also commonly assigned U.S. Pat. Nos. 3,811,076 by W. M. Smith, and 3,841,926, by R. A. Garnache and W. M. Smith, both filed on Jan. 2, 1973, there is disclosed a one device field effect transistor memory cell of the type described in the hereinabove identified Dennard patent which utilizes a layer of doped polysilicon and an N+ diffusion region in a P type conductivity semiconductor substrate separated by a dielectric medium disposed on the surface of the semiconductor substrate for forming the storage capacitor of the cell. The polysilicon layer extends beyond the storage capacitor to act as a field shield between adjacent cells by applying a negative bias or fixed negative potential to the polysilicon layer. The N+ diffusion region of the storage capacitor is formed by using a doped segment of an insulating layer disposed on the surface of the semiconductor substrate and outdiffusing the dopant into the substrate.

In IBM Technical Disclosure Bulletin, Vol. 21, No. 9, February 1979, pp. 3823-3825, there is disclosed a one device memory cell which advantageously uses two layers of polysilicon.

Although the cells described hereinabove do provide memories having a high density of cells in a planar or two dimensional arrangement, yet each cell does require a significant given area of semiconductor surface. To reduce the size of the given area for each cell, structures have been made wherein the cell is formed in a three dimensional arrangement, such as described in commonly assigned U.S. Pat. No. 4,335,450, filed on Jan. 30, 1980, by D. R. Thomas, wherein there is disclosed a cell having a transistor disposed on a sidewall of a groove or trench with the storage node disposed below the transistor.

Also, commonly assigned U.S. Pat. No. 4,397,075, filed on July 3, 1980, by J. J. Fatula, Jr. and P. L. Garbarino, and commonly assigned U.S. patent application having Ser. No. 182,724, filed on Aug. 29, 1980, by S. A. Abbas and R. C. Dockerty, describe a dense, vertical cell having the storage capacitor in a well or trench. Somewhat similar cells are disclosed in U.S. Pat. No. 4,327,476, filed on Dec. 7, 1979, and in IBM Technical Disclosure Bulletins, February 1975, by G. V. Clarke and J. E. Tomko, pp. 2579-2580, July 1982, by C. G. Jambotkar, pp. 593-596, and February 1984, by B. El-Kareh, R. R. Garnache and F. R. White, pp. 4699-4701.

Furthermore, commonly assigned U.S. Pat. No. 4,462,040, filed on May 7, 1979, by I. T. Ho and J. Riseman discloses a one device dynamic random access memory utilizing a trench having vertical sidewalls with the storage capacitor and the transfer device located within the trench, and U.S. Pat. Nos. 4,271,418, filed Oct. 29, 1979, and 4,225,945, filed Oct. 29, 1979, teach a one device memory cell formed in a groove or trench with the storage node located at the bottom of the trench, the bit/sense line at the top of this substrate and the transfer device on the sidewall of the trench.

DISCLOSURE OF THE INVENTION

It is an object of this invention to provide a memory cell, in a three dimensional arrangement including a groove or trench, requiring a very small area of the surface of a semiconductor substrate, which has a high storage capacity and means disposed within the groove or trench for isolating adjacent cells.

In accordance with the teachings of this invention, a memory cell, formed in a groove or trench, in a semiconductor substrate is provided which includes a storage capacitor located at the bottom of the trench, a bit/sense line disposed at the surface of the substrate, a transfer device located on the sidewall of the trench between the capacitor and the bit/sense line and a field shield for electrically isolating the storage capacitor.

The foregoing and other objects, features and advantages of the invention will be apparent form the following and more particular description of the preferred embodiments of the invention, as illustrated in the accompanying drawings.

BEST MODE FOR CARRYING OUT THE INVENTION

Figure 1:
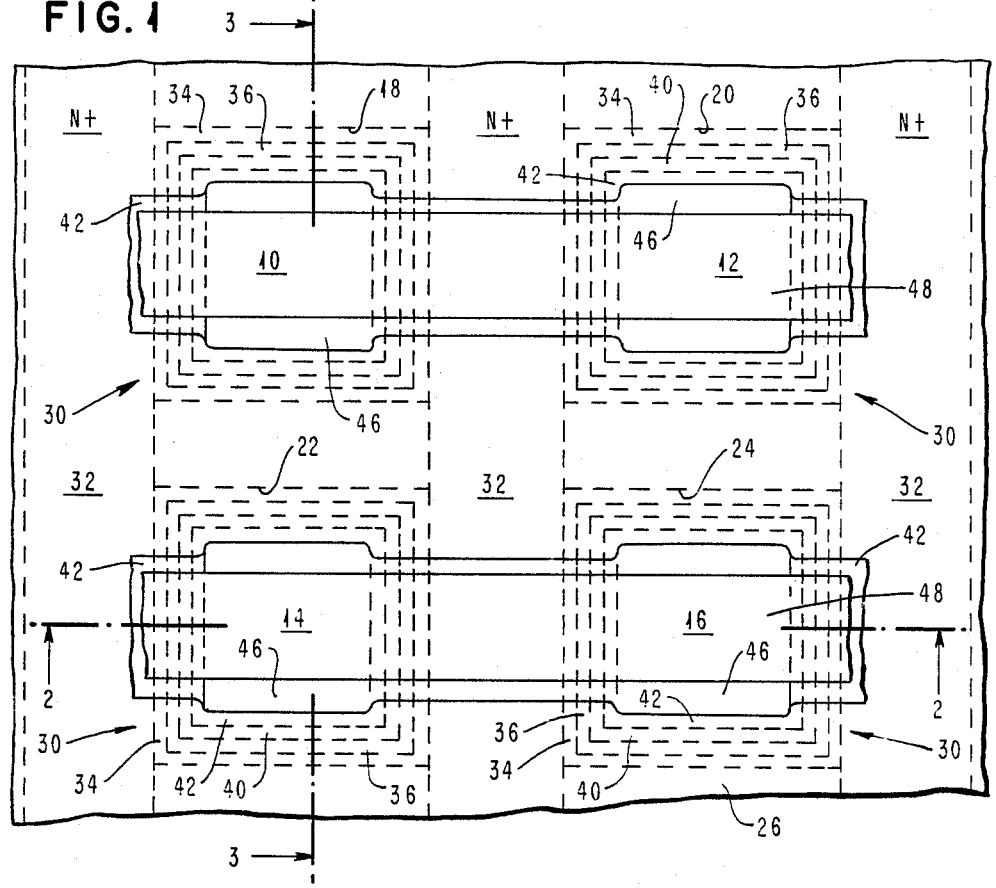
FIG. 1 is a plan view of an array of memory cells of the present invention.

Referring to the drawings in more detail, there is illustrated in FIG. 1 a plan view of an array of memory cells of the present invention. The array includes four memory cells 10, 12, 14 and 16 formed in trenches 18, 20, 22 and 24, respectively, located in a P type conductivity semiconductor substrate 26, as indicated also in the sectional views in FIGS. 2 and 3 of the drawings. Each of the cells 10, 12, 14 and 16 includes a first N+ diffusion region 28 disposed in the semiconductor substrate 26 at the bottom and along the lower portions of the sidewalls of the trenches 18, 20, 22 and 24. The first N+ diffusion region 28 acts as a storage node and serves as a first plate of a storage capacitor 30. A second N+ diffusion region 32 is disposed at the surface of the semiconductor substrate 26 adjacent to each of the trenches 18, 20, 22 and 24. The second N+ diffusion regions 32 are arranged in parallel, illustrated vertically in FIG. 1, to serve as bit/sense lines 32 for the array with each of the lines 32 associated with the cells of one column of the array. A first layer of silicon dioxide 34 is grown within the trenches 18, 20, 22 and 24 and over the second N+ diffusion regions 32, with the layer 34 being thicker over regions 32 due to the higher oxidation rate in the presence of the high N+ doping.

Figure 2:
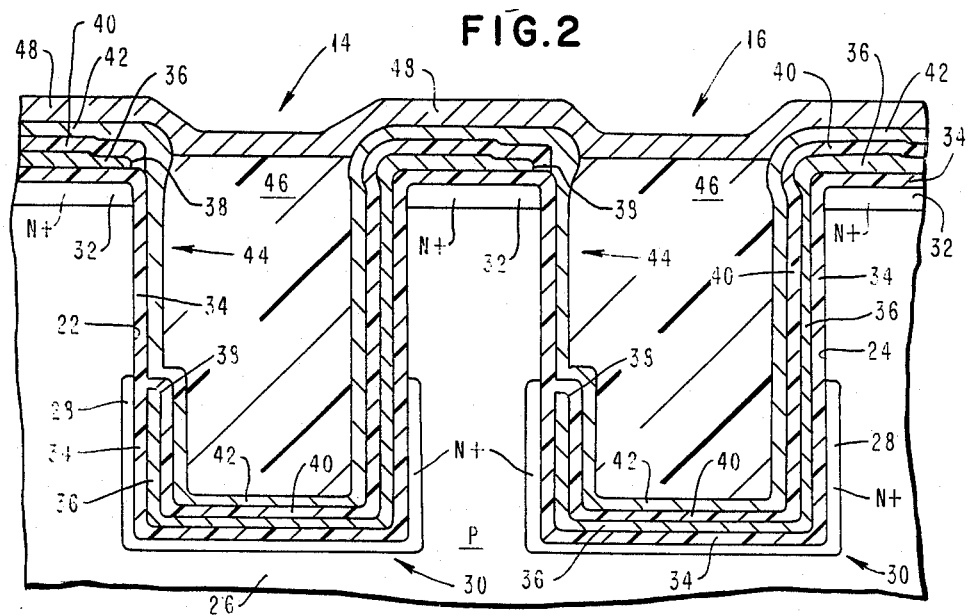
FIG. 2 is a sectional view of the array of cells illustrated in FIG. 1 of the drawings taken along line 2—2.

A first layer of doped polysilicon 36 is deposited over the first layer of silicon dioxide 34 within the trenches 18, 20, 22 and 24 and over the surface of the substrate 26. The first layer of doped polysilicon 36 serves as a second plate of the storage capacitor 30 and as a field shield between the storage capacitors 30 and the bit/sense lines 32 of each of the memory cells. An opening 38, as indicated in FIG. 2 of the drawings, is formed in the first layer of polysilicon 36 on one sidewall of each of the trenches 18, 20, 22 and 24 between the bit/sense line 32 and the adjacent edge of the first N+ diffusion region 28. A second layer of silicon dioxide 40 is grown over the remaining portions of the polysilicon layer 36. A second layer of doped polysilicon 42 is deposited over the second layer of silicon dioxide 40 and over the first layer of silicon dioxide 34 within the opening 38. The second polysilicon layer 42 serves as the control or gate electrode of a switch, transfer device or field effect transistor 44 which includes first and second N+ diffusion regions 28 and 32 acting as source/drain electrodes. The trenches 18, 20, 22 and 24 may now be completely filled with any suitable material such as polyimide 46. Conductive lines 48, which may be made of copper doped aluminum, are arranged in parallel, illustrated horizontally in FIG. 1, so that each of the lines 48 contacts the gate electrodes 42 of one row of cells of the array to act as a word line.

It can be seen from the teachings of this invention that a very dense array of cells is formed with each of the cells having a large storage capacitor within a trench along with a switching device and a field shield which prevents current or charge leakage between adjacent cells when an appropriate voltage is applied to the first polysilicon layer 36.

Figure 3:
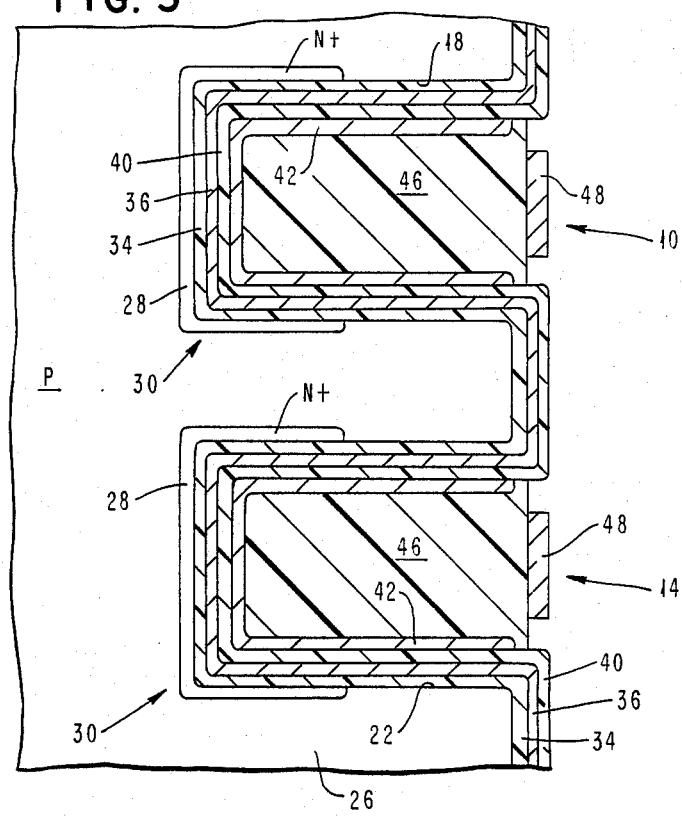
FIG. 3 is a sectional view of the array of cells illustrated in FIG. 1 of the drawings taken along line 3—3.

Writing data into and reading from the memory array illustrated in FIGS. 1-3 of the drawings is preformed in a manner similar to that described in the prior art, e.g., in the hereinabove cited Dennard patent.

Figure 4:
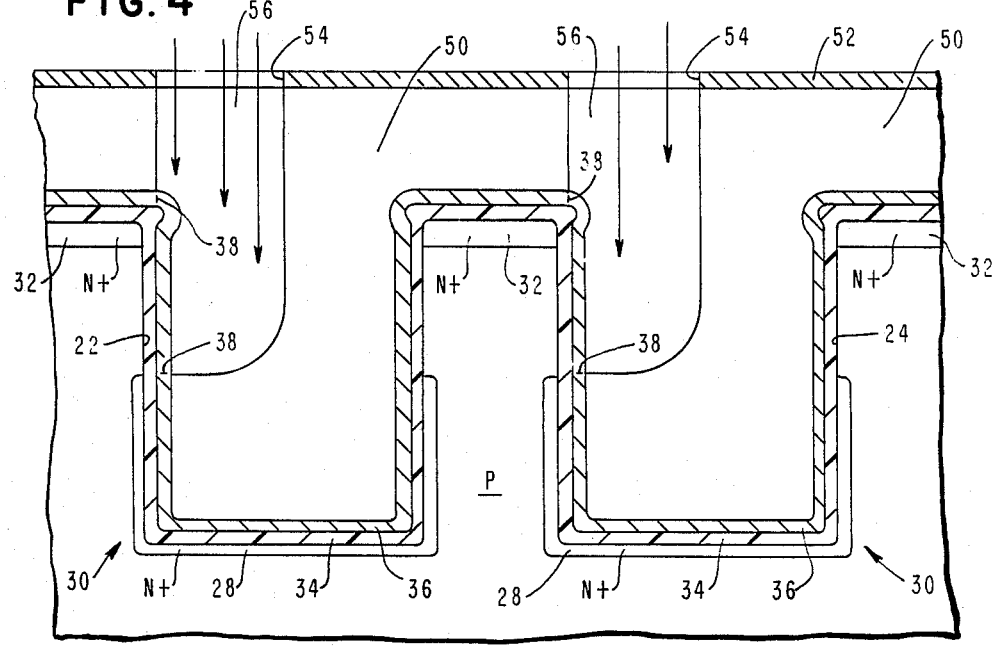
FIG. 4 is a sectional view similar to that of FIG. 2 but taken at an early step during the making of the array.

The cells 10, 12, 14 and 16 of the array of the present invention may be fabricated by any known process. For example, the N+ bit/sense line diffusion region 32 can be formed by defining a chemical vapor deposition (CVD) arsenic doped oxide layer into strips with a subsequent thermal drive in of the arsenic doping into the silicon substrate 26. A second CVD undoped oxide layer can be defined in strips running orthogonal to the doped oxide strips. The intersection of these orthogonal strips can then be used as a mask for etching the trenches 18, 20, 22 and 24 that are self aligned to the bit/sense line diffusion regions 32. The CVD oxide layers may subsequently be removed, or left in place to reduce bit/sense line capacitance. The trenches 18, 20, 22 and 24 may be formed by using reactive ion etching techniques and may be 5 microns deep with an opening of 1.5×1.5 microns or 2.25 square microns. The N+ diffusion regions 28 may be made by chemically vapor depositing a thin layer of doped silicon dioxide within the trenches, filling the trenches with any suitable material such as a photoresist to a desired level, e.g., as taught in commonly assigned U.S. Pat. No. 4,295,924, filed Dec. 17, 1979, by R. R. Garnache and D. M. Kenney, and issued on Oct. 20, 1981, and then etching the unwanted upper portions of the doped silicon dioxide. After removing the unwanted material from the trench, which defines the desired level of doped silicon dioxide within the trench, the dopant, e.g., arsenic, within the doped silicon dioxide is outdiffused into the bottom and sidewalls of the trenches to form the N+ diffusion regions 28. Furthermore, to form the opening 38 within the first polysilicon layer 34, after depositing the first polysilicon layer 34, the trenches 18, 20, 22 and 24 are filled with any suitable photoresist 50, as indicated in FIG. 4 of the drawings, and, with the use of an appropriate mask 52 having openings 54, wells 56 are formed in the photoresist 50 by using known reactive ion etching techniques. The mask 52 may be any known multi-level or multilayer photoresist mask having a non-erodable layer, e.g., polysilicon. After the wells 56 are formed in the photoresist 50, an appropriate wet etchant, such as $HNO_3/HF$, or a freon dry plasma etchant, may be used to form the openings 38 within the first polysilicon layer 36.

Although the first layer of polysilicon 36 may be continuous throughout the array, except for the openings 38, it should be understood that the second layer of polysilicon 42 must be appropriately etched into strips so that adjacent word lines 48 do not contact each other. To prevent storage node to storage node punch-through the P type doping between and below these nodes 28 should be about $5 \times 16^{16}$ to $1 \times 10^{17}$ atoms/cm$^3$ of boron. Also, if desired, the substrate 26 may have an N type conductivity with the diffusion regions 28 and 32 being of a P+ type conductivity without departing from the spirit of this invention. Likewise, dual oxide/nitride layers may be used where the silicon dioxide layers are indicated.

As can be understood from the above description and drawings of this invention, a significant density advance has been made in fast dynamic random access memories wherein, with presently known technology, memory chips each of which may have millions of cells formed therein, although for purposes of clarity only four are illustrated in the drawings, can be manufactured. Furthermore, each of these cells, which has an area of only four square or four features, is capable of storing a binary digit of information in a relatively large storage capacitor, thus, extremely sensitive sense amplifiers for detecting the stored signals in this very dense memory are not required. The vertical structure and arrangement of the cell elements within the trench provides a storage node capacitance which is relatively independent of cell area at the surface of the semiconductor substrate while electrically isolated from other cell elements resulting in a memory with improved density, signal strength and performance.

While the invention has been particularly shown and described with reference to preferred embodiments thereof, it will be understood by those skilled in the art that various changes in form and details may be made therein without departing from the spirit and scope of the invention.

What is claimed is:

1. A dynamic random access memory comprising
   a semiconductor substrate having a given surface and a trench formed therein, said trench having a sidewall,
   a storage capacitor having a plate disposed within said trench,
   a bit/sense line disposed at said given surface,
   a transfer device having a control electrode disposed within said trench between the plate of said storage capacitor and said bit/sense line, and
   means including a field shield for electrically isolating said storage capacitor, said means including a field shield being located within said trench and disposed on the sidewall thereof.

2. A dynamic random access memory as set forth in claim 1 wherein said storage capacitor and said means including a field shield include a first conductive layer having an opening therein and insulated from said substrate along the sidewalls and bottom of said trench and said transfer device includes a second conductive layer having a first portion overlapping and insulated from said first conductive layer and a second portion disposed within the opening in said first conductive layer and insulated from said sidewall between said storage capacitor and said bit/sense line.

3. A dynamic random access memory as set forth in claim 1 wherein said trench includes a bottom surface and said sidewall has a lower portion and said storage capacitor is disposed along the bottom surface of said trench and along the lower portion of the sidewalls of said trench.

4. A dynamic random access memory as set forth in claim 1 wherein said trench includes an inner surface and said storage capacitor includes a first diffusion region in said semiconductor substrate along the inner surface of said trench.

5. A dynamic random access memory as set forth in claim 4 wherein said trench further includes a bottom and said sidewall has a lower portion and said diffusion region is disposed along the bottom and the lower portion of the sidewalls of said trench.

6. A dynamic random access memory as set forth in claim 5 wherein said means including a field shield is disposed between said diffusion region and the given surface of said semiconductor substrate.

7. A dynamic random access memory as set forth in claim 6 wherein said storage capacitor and said means including a field shield include a first conductive layer insulated from said semiconductor substrate.

8. A dynamic random access memory as set forth in claim 7 wherein said bit/sense line includes a second diffusion region and said transfer device is disposed between said first and second diffusion regions.

9. A dynamic random access memory as set forth in claim 8 wherein said first conductive layer has an opening therein between said first and second diffusion regions and said transfer device includes a second conductive layer disposed within said opening and insulated from said first conductive layer and from said semiconductor substrate.

10. A dynamic random access memory as set forth in claim 9 wherein said semiconductor substrate is of a P type conductivity, said first and second diffusion regions are of N type conductivity and said first and second conductive layers are doped polysilicon and further including an insulating material disposed within said trench extending to the given surface of said substrate and a metallic line disposed on said insulating material and connected to said second conductive layer.

11. A dynamic random access memory as set forth in claim 10 wherein said insulating material is polyimide and said metallic line is copper doped aluminum.

12. A memory comprising
a semiconductor substrate having a major surface and a trench formed therein, said trench including a bottom and sidewalls having lower portions,
a first diffusion region disposed within said substrate at the bottom and lower portions of the sidewalls of said trench,
a second diffusion region disposed at the major surface of said substrate near said trench,
a first insulating layer disposed along the bottom and sidewalls of said trench and the major surface of said substrate,
a first conductive layer disposed on said first insulating layer and having an opening therein located between said first and second diffusion regions,
a second insulating layer disposed on said first conductive layer, and
a second conductive layer disposed on said second insulating layer and on said first insulating layer within the opening in said first conductive layer.

13. A memory as set forth in claim 12 further including insulating material disposed within said trench on said second conductive layer and extending to the major surface of said substrate and a metallic line disposed on said material and connected to said second conductive layer.

14. A memory as set forth in claim 13 wherein said substrate is silicon having P type conductivity, said first and second regions are of N type conductivity, said first and second insulating layers include silicon dioxide, said first and second conductive layers include polysilicon, said material is polyimide and said metallic line is copper doped aluminum.

15. A memory array comprising
a semiconductor substrate having a major surface and first, second, third and fourth trenches formed therein,
first and second bit/sense lines arranged parallel to each other, said first bit/sense line extending between said first and third trenches and said second bit/sense line extending between second and fourth trenches,
first and second word lines arranged parallel to each other and orthogonal to said first and second bit/sense lines, said first word line extending between said first and second trenches and said second word line extending between said third and fourth trenches,
first, second, third and fourth storage capacitors disposed within said first, second, third and fourth trenches, respectively,
first and second transfer devices disposed within said first and second trenches, respectively, said first device being coupled to said first bit/sense line and said first word line and said second transfer device being coupled to said second bit/sense line and said first word line,
third and fourth transfer devices disposed within said third and fourth trenches, respectively, said third device being coupled to said first bit/sense line and said second word line and said fourth device being coupled to said second bit/sense line and said second word line, said first, second, third and fourth transfer devices also being coupled to said first, second, third and fourth storage capacitors, respectively, and
first, second, third and fourth field shields disposed between said first, second, third and fourth storage capacitors and the major surface of said substrate.

16. A memory array as set forth in claim 15 wherein each of said storage capacitors includes a diffusion region disposed below the major surface of said semiconductor substrate, each of said first and second bit/sense lines includes a diffusion region disposed at the major surface of said semiconductor substrate and each of said word lines includes a metallic line.

17. A memory array as set forth in claim 16 wherein each of said storage capacitors is disposed at the bottom and along the lower portion of the sidewall of its respective trench.

* * * * *